US007603637B2

(12) United States Patent
Haehn

(10) Patent No.: US 7,603,637 B2
(45) Date of Patent: Oct. 13, 2009

(54) SECURE, STABLE ON CHIP SILICON IDENTIFICATION

(75) Inventor: Steven L. Haehn, Fort Collins, CO (US)

(73) Assignee: LSI Corporation, Milpitas, CA (US)

( * ) Notice: Subject to any disclaimer, the term of this patent is extended or adjusted under 35 U.S.C. 154(b) by 610 days.

(21) Appl. No.: 11/466,885

(22) Filed: Aug. 24, 2006

(65) Prior Publication Data

US 2008/0082875 A1    Apr. 3, 2008

(51) Int. Cl.
*G06F 17/50*    (2006.01)
*G06F 19/00*    (2006.01)

(52) U.S. Cl. .............................................. 716/4; 716/8
(58) Field of Classification Search ...................... 716/4, 716/8, 17; 714/726; 700/115; 702/73; 324/764; 365/225.7
See application file for complete search history.

(56) References Cited

U.S. PATENT DOCUMENTS

| | | | |
|---|---|---|---|
| 6,161,213 A | 12/2000 | Lofstrom | |
| 6,738,788 B1 | 5/2004 | Horng et al. | |
| 6,802,447 B2 | 10/2004 | Horng | |
| RE40,188 E * | 3/2008 | Lofstrom | ........................ 716/4 |
| 7,370,256 B2 * | 5/2008 | Ong | ............................ 714/731 |
| 7,442,583 B2 * | 10/2008 | Bonaccio et al. | ............. 438/130 |
| 2005/0183047 A1 | 8/2005 | Sapiro | |
| 2007/0241768 A1 * | 10/2007 | Erickson et al. | ................. 326/8 |
| 2008/0068003 A1 * | 3/2008 | Shipley et al. | ............... 324/116 |

OTHER PUBLICATIONS www.siidtech.com, web site for SiidTech Inc., captured on Aug. 24, 2006.

* cited by examiner

*Primary Examiner*—Vu A Le
(74) *Attorney, Agent, or Firm*—Luedeka, Neely & Graham, P.C.

(57) ABSTRACT

A circuit for providing a bit string, the circuit including a plurality of commonly wired, substantially identical bit cells in a string, where each bit cell is designed to read as only one of a logical high and a logical low upon a given input, and each bit cell comprises a bit in the bit string. An enable line is associated with each of the bit cells, where each enable line has a fuse that is adapted to be activated upon application of a signal by a tester. Each bit cell is configured so as to be logically isolated from all others of the plurality of bit cells in the string when the fuse associated with the bit cell is activated. The circuit is adapted such that bit cells having fuses that are activated are logically removed from the bit string.

15 Claims, 3 Drawing Sheets

SECURE, STABLE ON CHIP SILICON IDENTIFICATION

FIELD

This invention relates to the field of integrated circuit fabrication. More particularly, this invention relates to correcting soft bits in a bit stream, such as can be used to uniquely identify integrated circuits or provide an encryption key.

BACKGROUND

Integrated circuits have evolved into enormously complex devices, which are fabricated by equally complex processes. As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

Integrated circuits are typically processed in a wafer form on a common semiconducting substrate, which substrate typically holds something in the neighborhood of a few hundred individual integrated circuits, depending on die size and wafer size. A variety of information on the processing of the substrate is typically recorded in a database. Thus, while the integrated circuits are in wafer form, it is relatively easy to look back upon the recorded processing history for the integrated circuits, by first identifying the substrate upon which the integrated circuits reside, and then accessing the information for the substrate. Such information can be very useful in determining the causes of problems that might be noticed at a later point in the fabrication cycle.

However, once the individual integrated circuits are singulated and packaged, it might be impossible to determine the substrate from which a given integrated circuit was taken, and the processing that the substrate received. However, for a variety of different reasons, such information could be extremely useful. For example, determining the manufacturing history of an integrated circuit that failed in the field could give insight as to why the device failed and help prevent additional future failures for the same cause.

What is needed, therefore, is a system that overcomes problems such as those described above, at least in part.

SUMMARY

The above and other needs are met by a circuit for providing a bit string, the circuit including a plurality of commonly wired, substantially identical bit cells in a string, where each bit cell is designed to randomly read as only one of a logical high and a logical low upon a given input, and each bit cell comprises a bit in the bit string. The randomness comes from intrinsic process variation of the manufacturing process. An enable line is associated with each of the bit cells, where each enable line has a fuse that is adapted to disable the bit cell upon application of a signal by a tester. The fuse could be designed to create an open circuit or could be built using antifuse technology that results in a short circuit. In either case, changing the initial state of the fuse disables the bit cell, giving the user the ability to select which bits in the bit stream to use. Each bit cell is configured so as to be logically isolated from all others of the plurality of bit cells in the string when the fuse associated with the bit cell is activated. The circuit is adapted such that bit cells having fuses that are activated are logically removed from the bit string.

In this manner, so called soft cells that do not reliably read as one of either a logical high or a logical low are removed from the bit string, and the bit string is thus made stable across future reads of the string, and is therefore useful for a variety of purposes, including use as one or both of an identification string or an encryption key. In various embodiments, the bit string is an identification string or an encryption key. The invention also contemplates an integrated circuit including such a circuit.

According to another aspect of the invention there is described a method for providing a bit string by providing a specified input to a plurality of commonly wired, substantially identical bit cells in a string, where each bit cell is designed to read as only one of a logical high and a logical low upon the specified input, and each bit cell comprises a bit in the bit string. The bit cells that do not consistently provide only one of a logical high and a logical low upon the specified input are identified and designated as soft cells. The soft cells are logically isolated by open-circuiting a separate polysilicon fuse that is associated with each soft cell, which is accomplished by application of a signal from a tester. All the soft cells with open-circuited polysilicon fuses are logically removed from the bit string.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

With reference now to the figures, there is depicted a method and apparatus for providing a unique chip identification circuit 10 for an integrated circuit, which chip identification does not require specialized processing to create the unique identification for the integrated circuit, and which is stable and can be reliably read across repeated instances and a duration of time. In addition, the circuitry as described herein may also be used to produce a stable encryption key, and for other high security applications.

In basic concept, the circuitry 10 is added to each individual integrated circuit as a part of the mask set for the integrated circuits. Thus, as the integrated circuits are fabricated in wafer form, the circuit 10 is fabricated at the same time. Thus, no additional processing is required to fabricate the circuit 10.

Figure 1:
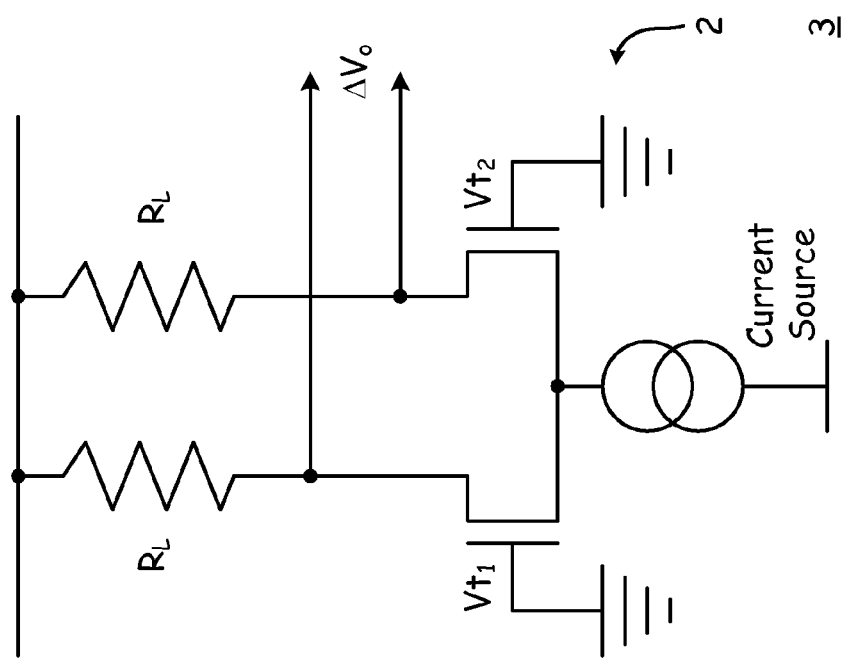
FIG. 1 is a circuit diagram of one embodiment of a die trace bit cell for use in a chip identification or encryption key circuit.

The circuit 10 preferably has at least one property such the circuits 10 on different chips will produce at least one characteristic that is different from chip to chip, even though the circuit 10 on each of the different chips receives the same input. FIG. 1 depicts one example of a die trace bit cell 2 on an integrated circuit 3, from which the circuit 10 can be constructed. It is appreciated that other circuits may also be used for the circuit 10. The cell 2 comprises two transistors having a voltage threshold $Vt_1$ and $Vt_2$. The two transistors are preferably connected to a common current source, ground, and current drain through two resistors $R_L$.

Because of the similarities in the fabrication and design of the two transistors, it might be expected that they would have exactly the same voltage threshold. However, very subtle differences in the transistors typically arise such as by "chance" or other uncharacterized processing and material differences. Thus, there tends to be a measurable difference $\Delta V_0$ between the voltage thresholds $Vt_1$ and $Vt_2$. Depending upon which of the two voltage thresholds is greater than the other, this voltage difference can be interpreted as either a logical zero or a logical one from the bit cell 2. Practically speaking, the value of the bit cell 2, either zero or one, tends to be completely random from one integrated circuit to another.

Figure 2:
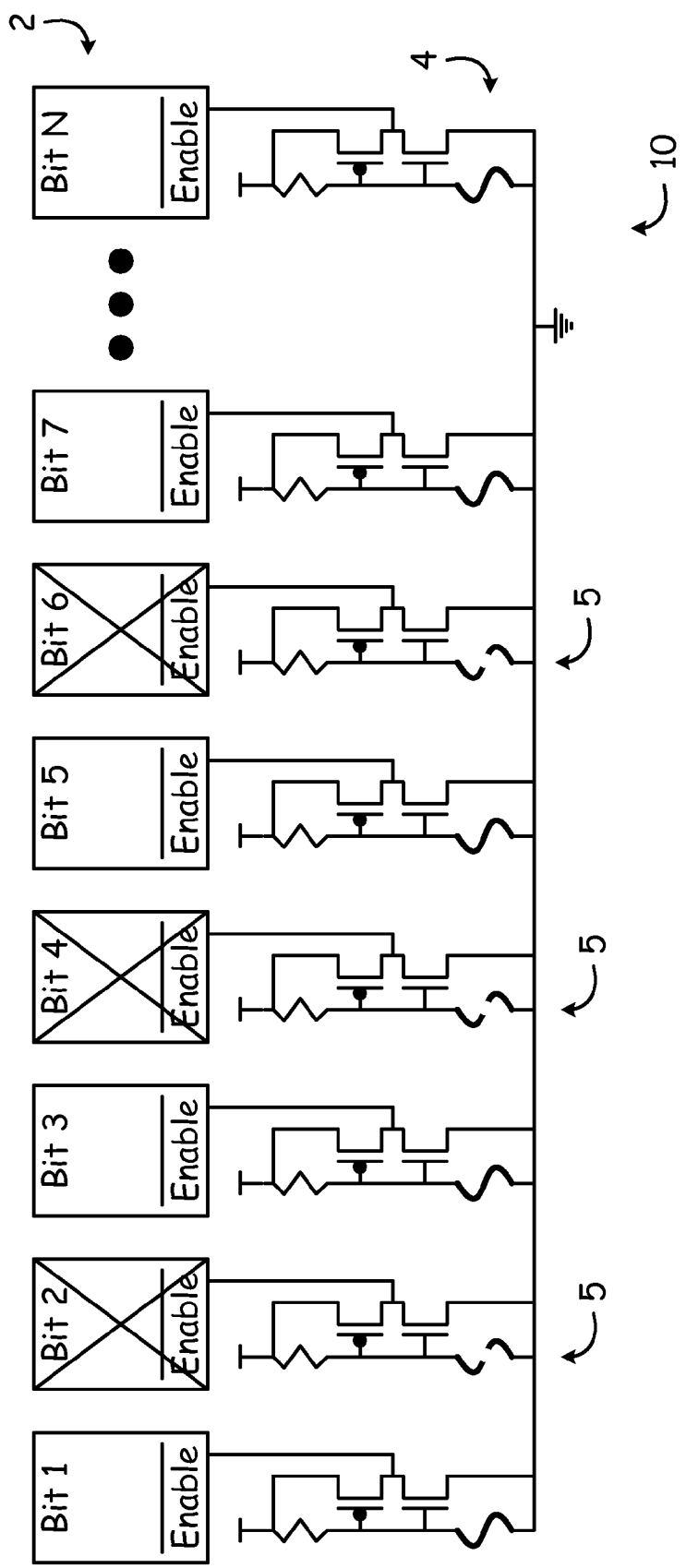
FIG. 2 is one embodiment of a chip identification or encryption key circuit.

Thus, by stringing together a given number of the bit cells 2—such as 128, 256, or some other number—a circuit 10, as depicted in FIG. 2, can be formed that has a desired number of random values. For example, 128 of the bit cells 2 could be formed into the circuit 10, which would then have a random 128 bit value. By forming a circuit 10 with a great enough number of bit cells 2 (where "great enough" is determined by the number of integrated circuits that are to be identified), each integrated circuit having the chip identification circuit 10 can be uniquely identified by reading the chip identification circuit 10. Further, a value of sufficient complexity can be formed for use as an encryption key, or for other security applications.

Unfortunately, some of the bit cells 2 have transistors with voltage thresholds $Vt_1$ and $Vt_2$ that are so close in value one to another, that the voltage differential $\Delta V_0$ is either so small that it cannot be reliably read, or actually flips back and forth in value from negative to positive (for example). Thus, such a bit cell 2, referred to as a soft cell that produces a soft bit, would tend to change its value in an unpredictable manner as it is read from time to time, thereby changing the value of the circuit 10. This tends to make the circuit 10 unreliable as a means for uniquely and repeatedly identifying the integrated circuit or producing an encryption key. Therefore, it is desirable to identify such soft cells 2 and remove them in some manner.

FIG. 2 depicts the preferred manner of removing bad cells 2 from the circuit 10. In FIG. 2 there are depicted a number of bit cells 2 in the integrated circuit 3, where it has been determined that some of the bit cells 2 are soft cells, or are otherwise inappropriate for use in the circuit 10 as described herein. These bad cells 2 are bit 2, bit 4, and bit 6 in the example depicted. There is preferably provided for each bit cell 2 in the circuit 10 an enable line as depicted, with a polysilicon fuse 4. The benefit of the polysilicon fuse 4 is that it can be severed such as by using a sufficient voltage or current, and does not need to be laser cut or otherwise manually/physically severed. Instead, the polysilicon fuse 4 can be opened using a standard automated tester. Thus, as depicted in FIG. 2, the fuses 5 for bit 2, bit 4, and bit 6 have been opened, which effectually removes bit 2, bit 4, and bit 6 from the circuit 10. This retains the stable bits in circuit 10, while removing the unstable bits.

Figure 3:
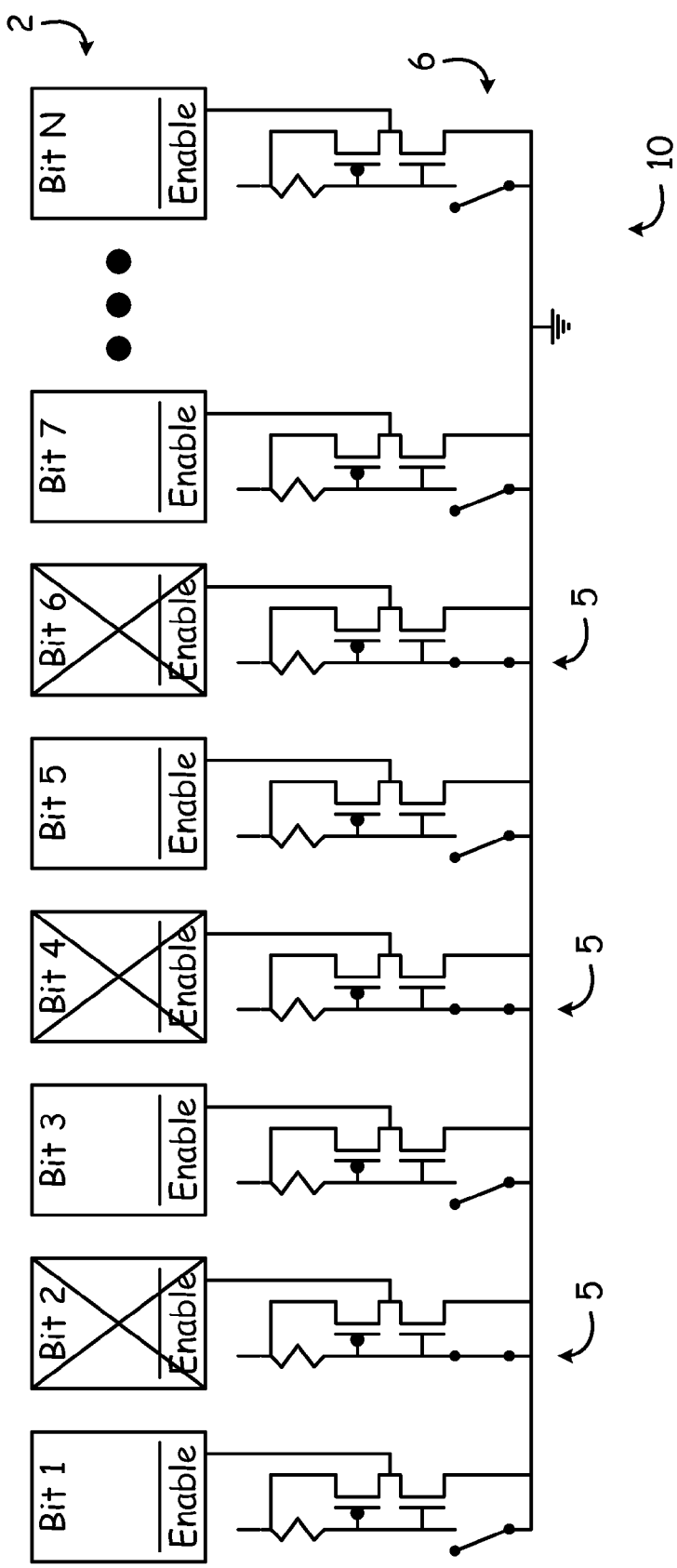
FIG. 3 is another embodiment of a chip identification or encryption key circuit.

This same effect could be achieved using antifuse technology where the antifuse 6 as depicted in FIG. 3 creates a short after being activated by the standard automated tester. In this situation the enable line of the selected bit is disabled when the antifuse is activated.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A circuit for providing a bit string, the circuit comprising:
   a plurality of commonly wired, substantially identical bit cells in a string, where each bit cell is designed to read as only one of a logical high and a logical low upon a given input, and each bit cell comprises a bit in the bit string,
   an enable line associated with each of the bit cells,
   each enable line having a fuse adapted to be activated upon application of a signal by a tester,
   each bit cell configured so as to be logically isolated from all others of the plurality of bit cells in the string when the fuse associated with the bit cell is activated, and
   the circuit adapted such that bit cells having fuses that are activated are logically removed from the bit string.

2. The circuit of claim 1, wherein the bit string comprises an identification string.

3. The circuit of claim 1, wherein the bit string comprises an encryption key.

4. The circuit of claim 1, wherein the fuse is a polysilicon fuse that is open-circuited upon application of the signal by the tester.

5. The circuit of claim 1, wherein the fuse is an antifuse that is close-circuited upon application of the signal by the tester.

6. An integrated circuit having a circuit for providing a bit string, the circuit comprising:
   a plurality of commonly wired, substantially identical bit cells in a string, where each bit cell is designed to read as only one of a logical high and a logical low upon a given input, and each bit cell comprises a bit in the bit string,
   an enable line associated with each of the bit cells,
   each enable line having a fuse adapted to be activated upon application of a signal by a tester,
   each bit cell configured so as to be logically isolated from all others of the plurality of bit cells in the string when the fuse associated with the bit cell is activated, and
   the circuit adapted such that bit cells having fuses that are activated are logically removed from the bit string.

7. The integrated circuit of claim 6, wherein the bit string comprises an identification string.

8. The integrated circuit of claim 6, wherein the bit string comprises an encryption key.

9. The integrated circuit of claim 6, wherein the fuse is a polysilicon fuse that is open-circuited upon application of the signal by the tester.

10. The integrated circuit of claim 6, wherein the fuse is an antifuse that is close-circuited upon application of the signal by the tester.

11. A method for providing a bit string, the method comprising the steps of:
   providing a specified input to a plurality of commonly wired, substantially identical bit cells in a string, where each bit cell is designed to read as only one of a logical high and a logical low upon the specified input, and each bit cell comprises a bit in the bit string, detecting the bit cells that do not consistently provide only one of a logical high and a logical low upon the specified input, designated as soft cells, logically isolating the soft cells by activating a separate fuse associated with each soft cell with a signal from a tester, and logically removing from the bit string all the soft cells with activated fuses.

12. The method of claim 11, wherein the bit string comprises an identification string.

13. The method of claim 11, wherein the bit string comprises an encryption key.

14. The method of claim 11, wherein the fuse is a polysilicon fuse that is open-circuited upon application of the signal by the tester.

15. The method of claim 11, wherein the fuse is an antifuse that is close-circuited upon application of the signal by the tester.

* * * * *